United States Patent
Yamamoto

(10) Patent No.: US 6,841,587 B2
(45) Date of Patent: Jan. 11, 2005

(54) UV-CURABLE PRESSURE-SENSITIVE ADHESIVE COMPOSITION AND ITS PRESSURE-SENSITIVE ADHESIVE SHEET

(75) Inventor: Shouji Yamamoto, Osaka (JP)

(73) Assignee: Nitto Denko Corporation, Osaka (JP)

( * ) Notice: Subject to any disclaimer, the term of this patent is extended or adjusted under 35 U.S.C. 154(b) by 3 days.

(21) Appl. No.: 10/622,797

(22) Filed: Jul. 21, 2003

(65) Prior Publication Data

US 2004/0019127 A1 Jan. 29, 2004

Related U.S. Application Data

(62) Division of application No. 09/793,108, filed on Feb. 27, 2001, now abandoned.

(30) Foreign Application Priority Data

Feb. 28, 2000 (JP) ..................................... P. 2000-56003

(51) Int. Cl.$^7$ ..................... H01L 21/78; C09J 133/04; C09J 175/04; C08F 2/50
(52) U.S. Cl. ..................... 522/39; 522/64; 522/126; 438/464
(58) Field of Search ..................... 522/39, 64, 126, 522/121; 438/464; 428/355 RA, 345

(56) References Cited

U.S. PATENT DOCUMENTS

| | | | |
|---|---|---|---|
| 4,720,317 A | * | 1/1988 | Kuroda et al. ............... 156/250 |
| 5,288,827 A | | 2/1994 | Li et al. |
| 5,384,007 A | | 1/1995 | Fischer |
| 5,476,565 A | * | 12/1995 | Akada et al. ............... 156/235 |
| 5,686,504 A | | 11/1997 | Ang |
| 5,714,029 A | * | 2/1998 | Uemura et al. ........... 156/275.5 |
| 6,224,949 B1 | | 5/2001 | Wright et al. |
| 6,358,606 B1 | | 3/2002 | Sakai et al. |
| 6,524,700 B2 | * | 2/2003 | Masuda et al. ............. 428/343 |
| 6,524,701 B1 | * | 2/2003 | Kondo et al. .......... 428/355 RA |
| 6,605,345 B2 | * | 8/2003 | Kanai et al. ................. 428/345 |
| 6,723,619 B2 | * | 4/2004 | Nagamoto et al. .......... 438/459 |
| 2002/0019454 A1 | * | 2/2002 | Kanai et al. ................... 522/64 |
| 2003/0008139 A1 | * | 1/2003 | Nagamoto et al. .......... 428/345 |

FOREIGN PATENT DOCUMENTS

| | | |
|---|---|---|
| EP | 1 262 533 * | 12/2002 |
| JP | 10-130591 A | 5/1998 |
| WO | WO 99/50902 A1 | 10/1999 |

OTHER PUBLICATIONS

Machine translation of JP A-10-130591, May 1998, Japanese Patent Office website.
XP-002255955 (1993) Patent Abstracts of Japan Abstract of JP 04366112.
European Search Report dated Oct. 13, 2003.

* cited by examiner

Primary Examiner—Susan Berman
(74) Attorney, Agent, or Firm—Sughrue Mion, PLLC

(57) ABSTRACT

Provided are a UV-curable pressure-sensitive adhesive composition comprising a photoinitiator which has a molar absorptivity at 365 nm of at least 1,000 mol$^{-1}$·cm$^{-1}$ and the maximum absorption wavelength of at least 420 nm on a long wavelength side; and an adhesive sheet having a layer of the composition disposed over a photo-transmitting base film. The pressure-sensitive adhesive sheet according to the invention can be cured even by exposure to ultraviolet rays at a low intensity or for short time so that it can contribute to energy saving and productivity improvement as a sheet for processing, fixation or surface protection of a semiconductor wafer.

1 Claim, No Drawings

UV-CURABLE PRESSURE-SENSITIVE ADHESIVE COMPOSITION AND ITS PRESSURE-SENSITIVE ADHESIVE SHEET

This application is a divisional of application Ser. No. 09/793,108, filed Feb. 27, 2001, now abandoned.

FIELD OF THE INVENTION

1. Field of the Invention

The present invention relates to a UV-curable pressure-sensitive adhesive composition and a pressure-sensitive adhesive sheet using the composition, particularly to a pressure-sensitive adhesive sheet useful for processing, fixation or surface protection of a semiconductor wafer.

2. Description of the Related Art

A semiconductor wafer such as silicon or gallium arsenide is first formed to have a large diameter and then subjected to back grinding (back-side grinding) to a predetermined thickness. Upon back grinding, a pressure-sensitive adhesive sheet is adhered to the surface of a wafer, which facilitates the above-described processing (back grinding) and at the same time prevents invasion of cutting water into the surface side of the wafer, thereby protecting the wafer surface. The semiconductor wafer is then cut and separated into element pieces by dicing and pickup. Also for facilitating these dicing and pickup steps, the wafer is fixed by a pressure-sensitive adhesive sheet adhered thereto.

Since such a pressure-sensitive adhesive sheet for processing, fixation or surface protection of a semiconductor wafer is peeled off and removed after use, it is requested to firmly adhere to the wafer during use for processing, fixation or surface protection, but upon peeling and removal, to be released easily from the wafer and not to contaminate the wafer due to adhesive residue (sticking of the pressure-sensitive adhesive). It is however not always easy to adjust the tackiness (adhesive strength) of an ordinarily-employed pressure-sensitive adhesive sheet to satisfy both performances.

As proposed in JP-A-60-196956 or JP-A-60-223139 (the term "JP-A" as used herein means an "unexamined published Japanese patent application), there has been an attempt to use an UV-curable pressure-sensitive adhesive sheet. The pressure-sensitive adhesive sheet disclosed therein adheres firmly to an adherend owing to its tackiness during its use for processing, fixation or surface protection. After use, that is, upon peeling after back grinding or pickup after dicing, curing of the pressure-sensitive adhesive by exposure to ultraviolet rays and lowering of its fluidity by a three-dimensional network structure imparted to it lower the tackiness to an adherend, thereby facilitating peeling of the pressure-sensitive adhesive sheet therefrom. At this time, adhesive residue to the adherent decreases and contamination to the adherend can be prevented.

In recent years, with a marked increase in the demand for semiconductor devices, there has been an increasing request for energy saving and improvement of productivity (throughput up) even in the back grinding step or a dicing and pickup step using the above-described pressure-sensitive adhesive sheet in the fabrication of semiconductor devices. A UV-curable pressure-sensitive adhesive sheet as proposed above has however difficulty in satisfying such a demand, when used as a pressure-sensitive adhesive sheet.

The reason is because a UV-curable pressure-sensitive adhesive sheet must be exposed to ultraviolet rays upon peeling after use to cure the adhesive and form a three-dimensional network structure. In order to accomplish this, intensity or time of UV irradiation must be increased. A heightening in the intensity of UV irradiation makes energy saving difficult, while elongation of irradiation time lowers productivity.

SUMMARY OF THE INVENTION

With the foregoing in view, an object of the present invention is to provide a UV-curable pressure-sensitive adhesive composition which can be cured even by exposure to UV rays at a low intensity or for short time and therefore, contribute to energy saving and improvement in the productivity when used for processing, fixation or surface protection of a semiconductor wafer; and a pressure-sensitive adhesive sheet using the composition.

In order to satisfy the above-described object, the present inventors first investigated the components of the conventional UV-curable pressure-sensitive adhesive composition and paid a particular attention to a photoinitiator contained in it. As a photoinitiator which is activated by exposure to ultraviolet rays and serves for polymerization and curing of polymerization components, used in such a conventional pressure-sensitive adhesive composition are 1-hydroxycyclohexyl phenyl ketone, benzoin, benzoin methyl ether, benzoin ethyl ether, benzoin isopropyl ether, benzyldiphenyl sulfide, tetramethylthiuram monosulfide, azobisisobutyronitrile, dibenzyl, diacetyl and β-chloroanthraquinone.

The above-exemplified photoinitiators however have a low molar absorptivity of less than 500 $mol^{-1} \cdot cm^{-1}$ at 365 nm, which is a characteristic absorption wavelength of a high-pressure mercury vapor lamp ordinarily employed as a UV generation source, suggesting that they are initiators having a low efficiency at the absorption wavelength. In addition, the maximum absorption wavelength on a long wavelength side is not greater than 400 nm and thus, a usable wavelength range is narrow. If intensity or time of UV irradiation is decreased, their efficiency as an initiator is not sufficient, resulting in insufficient curing. Incorporation of a large amount of a photoinitiator in order to prevent such a result is however not preferred, because an unreacted portion of the photoinitiator transfers and adheres to a semiconductor wafer, adherend, and becomes a contaminant.

Based on such a finding, the present inventors have found that by using a photoinitiator which has a molar absorptivity higher than that of the conventional one at 365 nm, a characteristic absorption wavelength of a high-pressure mercury vapor lamp, curing performance can be improved even by exposure to UV rays at a low intensity and at the same time, by making usable the absorption wavelength at a long wavelength range, a luminous wavelength range of a UV lamp having low irradiation intensity such as black light can be used effectively, leading to a further improvement in the curing performance; and completed the present invention.

In one aspect of the present invention, there are thus provided a UV-curable pressure-sensitive adhesive composition comprising a photoinitiator which has a molar absorptivity at 365 nm of 1,000 $mol^{-1} \cdot cm^{-1}$ or greater and the maximum absorption wavelength of 420 nm or greater on a long wavelength side; particularly the above-described UV-curable pressure-sensitive adhesive composition wherein the photoinitiator is contained in an amount of 0.4 to 20 wt. % based on the whole adhesive composition (solid content); and more specifically, the above-described UV-curable pressure-sensitive adhesive composition wherein the photoinitiator is 2-benzyl-2-dimethylamino-1-

(4-morpholinophenyl)-butanone-1 or bis(2,4,6-trimethylbenzoyl)-phenylphosphine oxide. In another aspect of the present invention, there are also provided a pressure-sensitive adhesive sheet comprising a photo-transmitting base film and a layer of a UV-curable pressure-sensitive adhesive composition of the above-described constitution formed thereover, particularly a pressure-sensitive adhesive sheet of the above-described constitution for processing, fixation or surface protection of a semiconductor wafer.

The term "molar absorptivity" as used herein means the value obtained by dividing the absorbance of a solution measured by a UV spectrophotometer, said solution having been prepared by dissolving a photoinitiator in a solvent wherein the photoinitiator is soluble. (ex. acetonitrile) at a proper mole concentration (ex. 1 mmol/liter) and charged in a quartz cell, by the mole concentration of the solution and thickness of the cell. The term "pressure-sensitive adhesive sheet" as used herein collectively means a pressure-sensitive adhesive sheet, pressure-sensitive adhesive tape and various adhesive products (pressure-sensitive adhesive label) analogous thereto in shape which have been used widely in the adhesion industry.

As described above, a specific photoinitiator is used for the UV-curable pressure-sensitive adhesive composition and its pressure-sensitive adhesive sheet according to the present invention so that owing to good reaction efficiency of the photoinitiator to UV rays and widely usable absorption wavelength, sufficient curing performance is available even by a UV irradiator of low irradiation intensity and in addition, it does not take long hours for curing. The composition or sheet of the present invention is therefore capable of largely contributing to energy saving and productivity improvement in the fabrication of a semiconductor. Since addition of a large amount of the above-described specific photoinitiator is not required in the invention, there is no danger of causing a problem that an unreacted portion of the photoinitiator remains and becomes a contaminant for the semiconductor wafer which is an adherend.

DETAILED DESCRIPTION OF THE INVENTION

The photoinitiator to be used in the invention has a molar absorptivity of at least 1000 mol$^{-1}$·cm$^{-1}$, preferably at least 1500 mol$^{-1}$·cm$^{-1}$ (usually, 30,000 mol$^{-1}$·cm$^{-1}$ or less) at 365 nm, which is a characteristic wavelength of a high-pressure mercury vapor lamp usually employed in the fabrication step of a semiconductor device; and at the same time, has the maximum absorption wavelength of at least 420 nm, preferably at least 430 nm (usually, 460 nm or less) on a long wavelength side. Typical examples of such a photoinitiator include 2-benzyl-2-dimethylamino-1-(4-morpholinophenyl)-butanone-1 represented by the below-described formula (1) and (2,4,6-trimethylbenzoyl)-phenylphosphine oxide represented by the below-described formula (2).

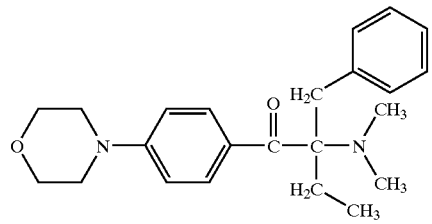

Formula (1)

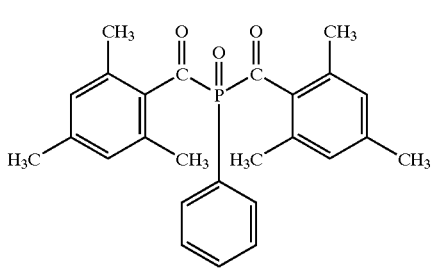

Formula (2)

In the invention, the photoinitiator is preferably used in an amount of 0.4 to 20 wt. %, especially 1 to 5 wt. % based on the whole pressure-sensitive adhesive composition (solid content). Amounts less than the above range deteriorate the curing reactivity upon exposure to ultraviolet rays, while those exceeding the above range tend to cause inconveniences such as contamination of a semiconductor wafer, an adherend, due to transfer and adhesion of an unreacted portion of the photoinitiator thereto. In some cases, the above-described photoinitiator can also be used in combination with the above-exemplified conventional one within an extent not damaging the advantages of the invention. It is also possible to use, together with the above-described photoinitiator, a polymerization promoter such as isoamyl P-dimethylaminobenzoate or ethyl P-dimethylaminobenzoate.

The UV-curable pressure-sensitive adhesive composition of the invention is similar to the conventional ones in components except for the use of the above-described specific photoinitiator. It can usually be prepared by incorporating a polymerization component and the above-described specific photoinitiator in a pressure-sensitive adhesive polymer employed as a base and optionally adding, to the resulting composition, an ordinarily-employed additive such as crosslinking agent (polyisocyanate compound, melamine compound, urea resin, epoxy resin, acid anhydride, polyamine or carboxyl-containing polymer), plasticizer, surfactant, tackifier, filler and/or colorant as needed.

As the pressure-sensitive adhesive polymer, various polymers such as rubbery, acrylic, silicone and vinyl ester polymers can be employed, with acrylic polymers being particularly preferred. Examples of the acrylic polymer include homopolymers or copolymers of an alkyl (meth)acrylate (ex. methyl, ethyl, butyl, 2-ethylhexyl, octyl or isononyl (meth)acrylate), and copolymers of the above-exemplified alkyl (meth)acrylate and another copolymerizable monomer such as a hydroxyalkyl (meth)acrylate (ex. hydroxyethyl, hydroxybutyl or hydroxyhexyl (meth)acrylate), glycidyl (meth)acrylate, (meth)acrylic acid, itaconic acid, maleic anhydride, (meth)acrylic amide, (meth)acrylic N-hydroxymethylamide, an alkylaminoalkyl (meth)acrylate (ex. dimethylaminoethyl or t-butylaminoethyl (meth)acrylate), vinyl acetate, styrene or acrylonitrile.

Such an acrylic polymer usually has a weight-average molecular weight of at least 200,000, preferably 300,000 to 2,000,000, more preferably 500,000 to 1,500,000. The glass transition point of this acrylic polymer is usually 0° C. or less, preferably about −100° C. to −20° C., so that it exhibits tackiness at normal temperature (23° C.). Pressure-sensitive adhesive polymers including this acrylic polymer may be used either singly or in combination. The acrylic polymer can be converted into the corresponding reactive polymer which is cured by exposure to ultraviolet rays, by introducing a carbon-to-carbon double bond in its main chain or side chain. In this case, a polymerization component which will be described below may be incorporated in the pressure-sensitive adhesive composition.

As the polymerization component, a monomer or oligomer having, in a molecule thereof, a carbon-to-carbon double bond and being curable by radical polymerization may be employed. Specific examples include esters of (meth)acrylic acid and a polyhydric alcohol such as trimethylolpropane tri(meth)acrylate, pentaerythritol tri(meth)acrylate, tetraethyleneglycol di(meth)acrylate, 1,6-hexanediol di(meth)acrylate, neopentylglycol di(meth)acrylate and dipentaerythritol hexa(meth)acrylate, ester acrylate oligomers, isocyanurate, isocyanurate compounds such as 2-propenyldi-3-butenyl cyanurate, 2-hydroxyetrhylbis(2-acryloxyethyl) isocyanurate and tris (2-methacryloxyethyl) isocyanurate and various urethane oligomers. The above-exemplified polymerization component is usually added in an amount of 5 to 200 parts by weight, preferably 20 to 150 parts by weight, more preferably 50 to 120 parts by weight based on 100 parts by weight of the pressure-sensitive adhesive polymer.

The pressure-sensitive adhesive sheet of the invention is obtained by disposing, on one side or both sides of a photo-transmitting base film, a layer of the above-described UV-curable pressure-sensitive adhesive composition to give a single-side thickness of 1 to 100 μm, preferably 3 to 50 μm. Onto the layer of the pressure-sensitive adhesive composition, a separator is adhered as needed in order to protect or smoothen the adhesive surface or improve the handling ease upon label processing. The above-described layer of the UV-curable pressure-sensitive adhesive composition is formed by applying the above-described composition to a base material and, if necessary, heating it to dry and then subjecting it to crosslinking treatment with a crosslinking agent.

As the photo-transmitting base film, a material permitting transmission of UV rays therethrough is selectively employed, because curing in the final step is conducted by exposure to ultraviolet rays. Usually, preferred is a transparent film made of polyethylene, polypropylene, polybutene, polybutadiene, polymethyl pentene, polyvinyl chloride, vinyl chloride copolymer, polyethylene terephthalate, polybutylene terephthalate, polyurethane, ethylene-vinyl acetate copolymer, ionomer resin, ethylene-(meth)acrylic acid copolymer, ethylene-alkyl meth(acrylate) copolymer, polystyrene or polycarbonate.

The above-described transparent film may be either a film obtained by crosslinking by electron rays or a film laminated by the conventional method such as coextrusion or dry lamination. Alternatively, the transparent film may be a resin-mixed film which has been mixed for improving expanding properties of the film, a film having film strength improved by stretching, or a film subjected to ordinarily physical or chemical treatment such as mat treatment, corona charge treatment or primer treatment. The photo-transmitting base film made of such a transparent film is usually preferred to have a thickness of 40 to 150 μm.

Examples of the separator to be used in the invention include those made of paper and those made of a synthetic resin film such as polyethylene, polypropylene, polyethylene terephthalate or Teflon. If necessary, the surface of the separator is subjected to peel-facilitating treatment such as silicone treatment, long-chain alkyl treatment or fluorine treatment to heighten the releasability of the separator from the layer of the pressure-sensitive adhesive composition. Kneading of a ultraviolet absorber or light scattering agent in a separator film or back treatment of the film is desired, because such a treatment makes it possible to roll up the pressure-sensitive adhesive sheet into a tape roll with the separator portion being disposed outside, thereby heightening the shelf life of it in the form of a tape roll under the environment of a fluorescent lamp. The separator usually has a thickness of 10 to 200 μm, preferably 25 to 100 μm.

The pressure-sensitive adhesive sheet of the invention thus formed exhibits sufficient adhesion to a semiconductor wafer, which is an adherend, prior to exposure to ultraviolet rays. After it fulfills its role, it easily cures and forms a three-dimensional network structure by exposure to ultraviolet rays at a low intensity or for a short period, which lowers tackiness to the adherend and facilitates peeling. At this time, no adhesive residue to the adherend is observed so that the adherend is free from contamination. Thus, energy saving and improvement of productivity in the fabrication of a semiconductor device can be attained easily by the use of the pressure-sensitive adhesive sheet of the invention for processing (back grinding or etching), fixation (dicing and pickup) or surface protection of a semiconductor wafer.

EXAMPLES

The present invention will hereinafter be described more specifically by Examples. It should however be born in mind that the present invention is not limited to or by the below-described Examples. In all the designations, "part" or "parts" means part or parts by weight.

Example 1

By copolymerization of 95 parts of n-butyl acrylate and 5 parts of acrylic acid in a conventional manner, a solution containing the acrylic polymer having a weight-average molecular weight of 1,000,000 was obtained. To the resulting solution, were added 60 parts of dipentaerythritol hexaacrylate as a polymerization component, 3 parts [corresponding to 1.79 wt. % of the whole pressure-sensitive adhesive composition (solid content)] of 2-benzyl-2-dimethylamino-1-(4-morpholinophenyl)-butanone-1 (having a molar absorptivity of 1,500 $mol^{-1} \cdot cm^{-1}$ at a light wavelength of 365 nm and the maximum absorption wavelength of 435 nm on a long wavelength side) as a photoinitiator and 5 parts of a polyisocyanate compound ["Colonate L", trade name; product of Nippon Polyurethane) as a crosslinking agent. The resulting mixture was dissolved in a toluene solvent to prepare a solution of a UV-curable pressure-sensitive adhesive composition. The resulting solution was applied to the surface of a 100 μm thick polyethylene film (one side subjected to corona discharge treatment and the other side subjected to emboss mat treatment) subjected to corona discharge treatment, followed by heating at 80° C. for 10 minutes, drying and crosslinking, whereby a layer of the UV-curable pressure-sensitive adhesive composition having a thickness of 20 μm was formed. A separator was adhered to the adhesive surface of the layer to form a pressure-sensitive adhesive sheet.

Example 2

By copolymerization of 60 parts of n-butyl acrylate, 10 parts of methyl methacrylate and 30 parts of 2-hydroxyethyl acrylate, an acrylic polymer having a weight-average molecular weight of 400,000 was obtained. The resulting polymer was reacted with 7.5 parts of methacryloyloxyethyl isocyanate to yield a reactive acrylic polymer having, at the side chain thereof, a carbon-to-carbon double bond. To 100 parts of the resulting reactive acrylic polymer, were added 1 part [corresponding to 1 wt. % of the whole pressure-sensitive adhesive composition (solid content)] of 2-benzyl-2-dimethylamino-1-(4-morpholinophenyl)-butanone-1 as a photoinitiator and 0.5 part of a polyisocyanate compound ["Colonate L", similar to Example 1) as a crosslinking agent. The resulting mixture was dissolved in a toluene solvent to prepare a solution of a UV-curable pressure-sensitive adhesive composition. The resulting solution was applied to the surface of a 100 μm thick polyester film (one side subjected to corona discharge treatment) subjected to corona discharge treatment, followed by heating at 80° C. for 10 minutes, drying and crosslinking, whereby a layer of the UV-curable pressure-sensitive adhesive composition having a thickness of 20 μm was formed. A separator was then adhered to the adhesive surface of the layer to form a pressure-sensitive adhesive sheet.

Example 3

In a similar manner to Example 1 except for the use of 3 parts [corresponding to 1.79 wt. % of the whole pressure-sensitive adhesive composition (solid content)] of bis(2,4,6-trimethylbenzoyl)-phenylphosphine oxide (having a molar absorptivity of 5,000 $mol^{-1} \cdot cm^{-1}$ at a light wavelength of 365 nm and the maximum absorption wavelength of 445 nm on a long wavelength side) as a photoinitiator, a solution of a UV-curable pressure-sensitive adhesive composition was prepared. As in Example 1, the resulting solution was used to produce a pressure-sensitive adhesive sheet.

Comparative Example 1

In a similar manner to Example 1 except for the use of 3 parts of 2,2-dimethoxy-1,2-diphenylethan-1-one ("Irgacure 651", trade name; product of Ciba Specialty Chemicals; having a molar absorptivity of 150 $mol^{-1} \cdot cm^{-1}$ at a light wavelength of 365 nm and the maximum absorption wavelength of 400 nm on a long wavelength side) as a photoinitiator, a solution of a UV-curable pressure-sensitive adhesive composition was prepared. As in Example 1, the resulting solution was used to produce a pressure-sensitive adhesive sheet.

Comparative Example 2

In a similar manner to Example 2 except for the use of 1 part of 1-hydroxy-cyclohexyl-phenyl-ketone ("Irgacure 184", trade name; product of Ciba Specialty Chemicals; having a molar absorptivity of 25 $mol^{-1} \cdot cm^{-1}$ at a light wavelength of 365 nm and the maximum absorption wavelength of 400 nm on a long wavelength side) as a photoinitiator, a solution of a UV-curable pressure-sensitive adhesive composition was prepared. As in Example 2, the resulting solution was used to produce a pressure-sensitive adhesive sheet.

Comparative Example 3

In a similar manner to Example 1 except for the use of 3 parts of 2-methyl-1-[4-(methylthio)phenyl]-2-morpholinopropane-1 ("Irgacure 907", trade name; product of Ciba Specialty Chemicals; having a molar absorptivity of 200 $mol^{-1} \cdot cm^{-1}$ at a light wavelength of 365 nm and the maximum absorption wavelength of 385 nm on a long wavelength side) as a photoinitiator, a solution of a UV-curable pressure-sensitive adhesive composition was prepared. As in Example 1, the resulting solution was used to produce a pressure-sensitive adhesive sheet.

With regards to pressure-sensitive adhesive sheets obtained in Examples 1 to 3 and Comparative Examples 1 to 3, peeling adhesive strength before and after exposure to ultraviolet rays were measured. In addition, adhesive residue upon peeling after exposure to ultraviolet rays was studied. The results are as shown in Table 1 (peeling adhesive strength) and Table 2 (adhesive residue).

<Test of Peeling Adhesive strength>

A pressure-sensitive adhesive sheet was cut, in the direction of flow, into a sample piece of 20 mm wide and 12 cm long and adhered to a silicon mirror wafer. After it was allowed to stand for about 30 minutes, peeling adhesive strength before exposure to ultraviolet rays was measured. In addition, the peeling adhesive strength was measured after exposure to ultraviolet rays under the below-described conditions of A to C. Measurement was conducted using Tensilon at a pulling rate of 300 mm/min at a peeling angle of 180° C.

<Conditions A> (Corresponding to Those Employed Now)
Light source: high-pressure mercury vapor lamp, exposure at the intensity of 50 mW/cm² (Measuring apparatus: "Ultraviolet illuminometer UT-101", product of USHIO INC.) for 20 seconds.

<Conditions B> (Conditions Permitting Productivity Improvement)
Light source: high-pressure mercury vapor lamp, exposure at the intensity of 50 mW/cm² (Measuring apparatus: "Ultraviolet illuminometer UT-101", product of USHIO INC.) for 1 second.

<Conditions C> (Conditions Permitting Energy Saving)
Light source: high-pressure mercury vapor lamp, exposure at the intensity of 8 mW/cm² (Measuring apparatus: "Ultraviolet illuminometer UT-101", product of USHIO INC.) for 15 seconds.

<Test on Adhesive Residue>

A pressure-sensitive adhesive sheet was adhered to a 4-inch silicon mirror wafer. After it was allowed to stand for 20 minutes, the sheet was exposed to ultraviolet rays under similar conditions A to C to those employed for peeling adhesive strength. Then, the sheet was peeled from the silicon wafer. After peeling, the surface of the wafer was observed visually or by a microscope (magnification:×50 to 100) in order to study the existence of adhesive residue.

TABLE 1

| | Peeling Adhesive strength Test (N/20 mm wide) | | | |
| --- | --- | --- | --- | --- |
| | Before | After exposure to UV rays | | |
| | exposure to UV rays | Conditions A | Conditions B | Conditions C |
| Example 1 | 2.0 | 0.15 | 0.16 | 0.15 |
| Example 2 | 2.5 | 0.20 | 0.23 | 0.20 |
| Example 3 | 2.0 | 0.15 | 0.15 | 0.15 |
| Comparative Example 1 | 2.0 | 0.15 | 0.70 | 1.2 |
| Comparative Example 2 | 2.5 | 0.20 | 0.55 | 0.80 |
| Comparative Example 3 | 2.0 | 0.15 | 0.65 | 1.0 |

TABLE 2

| | Adhesive residue test | | |
|---|---|---|---|
| | Conditions A | Conditions B | Conditions C |
| Example 1 | None | None | None |
| Example 2 | None | None | None |
| Example 3 | None | None | None |
| Comp. Ex. 1 | None | Observed | Observed |
| Comp. Ex. 2 | None | None | Observed |
| Comp. Ex. 3 | None | Observed | Observed |

As is apparent from the results of Table 1 and Table 2, it has been found that each of the pressure-sensitive adhesive sheets of Examples 1 to 3 using a photoinitiator specified in the invention exhibited good adhesion prior to exposure to UV rays, and after exposure to UV rays at a low intensity or for short time, they had lowered adhesion by curing, became easily releasable and did not cause adhesive residue upon peeling, thus they can contribute largely to energy saving and improvement of productivity in the fabrication of a semiconductor wafer.

On the other hand, each of the pressure-sensitive adhesive sheets of Comparative Examples 1 to 3 using a conventional photoinitiator exhibited good adhesion prior to exposure to UV rays, and after curing by exposure to UV rays under usual conditions, they had lowered adhesion enough for cause peeling and was free from the problem of adhesive residue. By exposure to UV rays at a low intensity or for short time, however, adhesion did not lower owing to insufficient curing and the problem of adhesive residue occurred so that it is impossible to attain energy saving and improvement of productivity in the fabrication of a semiconductor wafer.

While the invention has been described in detail and with reference to specific embodiments thereof, it will be apparent to one skilled in the art that various changes and modifications can be made therein without departing from the spirit and scope thereof.

This application is based on Japanese patent applications No. 2000-056003 filed on Feb. 28, 2000, the entire content of which incorporated herein by reference.

What is claimed is:

1. A method for processing a semiconductor wafer comprising the steps of:

adhering a pressure-sensitive adhesive sheet to a semiconductor wafer, the pressure-sensitive adhesive sheet comprising a photo-transmitting base film, and a layer comprising an ultraviolet-curable pressure-sensitive adhesive composition comprising a photoinitiator having a molar absorptivity at 365 nm of at least 1,000 $mol^{-1} \cdot cm^{-1}$ and a maximum absorption wavelength of at least 420 nm;

exposing the pressure-sensitive adhesive sheet to an ultraviolet ray; and peeling the pressure-sensitive adhesive sheet from the semiconductor wafer.

* * * * *